(12) United States Patent
Wildeson et al.

(10) Patent No.: US 12,104,755 B2
(45) Date of Patent: Oct. 1, 2024

(54) PATTERNED REFLECTIVE GRIDS FOR LED ARRAYS AND DISPLAYS

(71) Applicant: Lumileds LLC, San Jose, CA (US)

(72) Inventors: Isaac Wildeson, San Jose, CA (US); Hossein Lotfi, Fremont, CA (US); Toni Lopez, Vaals (NL); Oleg Borisovich Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 401 days.

(21) Appl. No.: 17/217,922

(22) Filed: Mar. 30, 2021

(65) Prior Publication Data

US 2022/0316663 A1    Oct. 6, 2022

(51) Int. Cl.
| | |
|---|---|
| *F21K 9/68* | (2016.01) |
| *F21K 9/90* | (2016.01) |
| *H01L 25/075* | (2006.01) |
| *H01L 33/00* | (2010.01) |
| *H01L 33/50* | (2010.01) |
| *H01L 33/60* | (2010.01) |
| *G06F 1/16* | (2006.01) |

(52) U.S. Cl.
CPC .................. *F21K 9/68* (2016.08); *F21K 9/90* (2013.01); *H01L 25/0753* (2013.01); *H01L 33/0095* (2013.01); *H01L 33/50* (2013.01); *H01L 33/60* (2013.01); *G06F 1/1686* (2013.01); *H01L 2933/0041* (2013.01); *H01L 2933/0058* (2013.01); *H01L 2933/0091* (2013.01)

(58) Field of Classification Search
CPC . H01L 25/0753; H01L 33/60; H01L 33/0095; H01L 33/50; H01L 2933/0041; H01L 2933/0058; H01L 2933/0091; F21K 9/68; F21K 9/90; G06F 1/1686
See application file for complete search history.

(56) References Cited

U.S. PATENT DOCUMENTS

| | | | |
|---|---|---|---|
| 7,211,831 B2 | 5/2007 | Erchak et al. | |
| 10,205,055 B2 | 2/2019 | Chu et al. | |
| 11,329,199 B2* | 5/2022 | Göötz | H01L 33/508 |
| 11,552,222 B2* | 1/2023 | Lin | H01L 33/504 |
| 11,680,696 B2* | 6/2023 | Van Der Sijde | F21V 5/007 |
| | | | 362/235 |
| 2006/0204865 A1 | 9/2006 | Erchak et al. | |
| 2012/0273752 A1 | 11/2012 | Lee et al. | |

(Continued)

OTHER PUBLICATIONS

From the International Application Division of KIPO as the ISA, Notification of Transmittal of the International Search Report and the Written Opinion of the International Searching Authority, or the Declaration, PCT/US2022/019264, Jun. 28, 2022, 11 pages.

*Primary Examiner* — Bao Q Truong

(57) ABSTRACT

LED arrays comprise patterned reflective grids that enhance the contrast ratio between adjacent pixels or adjacent groups of pixels in the array. The pattern on the reflective grid may also improve adhesion between the reflective grid and one or more layers of material disposed on and attached to the reflective grid. The reflective grid may be formed, for example, as a reflective metal grid, a grid of dielectric reflectors, or a grid of distributed Bragg reflectors (DBRs). If formed as a metal grid, the reflective grid may provide electrical contact to one side of the LED diode junctions. This specification also discloses fabrication processes for such LED arrays.

12 Claims, 9 Drawing Sheets

(56) References Cited

U.S. PATENT DOCUMENTS

| | | |
|---|---|---|
| 2014/0186979 A1 | 7/2014 | Tu et al. |
| 2015/0155330 A1* | 6/2015 | Oh ........................ H01L 33/647 |
| | | 257/89 |
| 2015/0362165 A1* | 12/2015 | Chu ........................ H01L 33/32 |
| | | 362/235 |
| 2019/0198564 A1 | 6/2019 | Tandon et al. |
| 2019/0237452 A1* | 8/2019 | Kuo ...................... H01L 33/502 |
| 2021/0005583 A1* | 1/2021 | Iguchi ................. H01L 25/0753 |
| 2021/0043617 A1 | 2/2021 | Onuma et al. |
| 2021/0288105 A1* | 9/2021 | Kawanishi .............. H01L 33/60 |

\* cited by examiner

PATTERNED REFLECTIVE GRIDS FOR LED ARRAYS AND DISPLAYS

FIELD OF THE INVENTION

The invention relates generally to light emitting diode (LED) arrays, light sources comprising LED arrays, and displays comprising LED arrays.

BACKGROUND

Inorganic LEDs have been widely used to create different types of displays, matrices and light engines including automotive adaptive headlights, augmented-reality (AR) displays, virtual-reality (VR) displays, mixed-reality (MR) displays, smart glasses and displays for mobile phones, smart watches, monitors and TVs, and flash illumination for cameras in mobile phones. The individual LED pixels in these architectures could have an area of a few square millimeters down to a few square micrometers depending on the matrix or display size and its pixel per inch requirements. These types of LED matrices/displays are generally realized by transfer and attachment of individual pixels from a donor substrate to a controller backplane or electronic board. Such arrays may also be created by a monolithic approach where a monolithically integrated array of LED pixels is processed into an LED module on the donor epitaxial wafer and then transferred and attached to a controller backplane.

One of the key specifications for such arrays/displays is the contrast ratio (CR). CR is defined as the luminance ratio of one or a group of "ON" state pixel(s) vs. adjacent "OFF" state pixels. This means CR is greatly degraded when photons spill from an "ON" state pixel to neighboring "OFF" state pixels. Low CR typically results in blurry images or compromised projected beam patterns.

SUMMARY

This specification discloses LED arrays comprising patterned reflective grids that enhance the contrast ratio between adjacent pixels or adjacent groups of pixels in the array. The pattern on the reflective grid may also improve adhesion between the reflective grid and one or more layers of material disposed on and attached to the reflective grid. The reflective grid may be formed, for example, as a reflective metal grid, a grid of dielectric reflectors, or a grid of distributed Bragg reflectors (DBRs). If formed as a metal grid, the reflective grid may provide electrical contact to one side of the LED diode junctions. This specification also discloses fabrication processes for such LED arrays.

The LED arrays disclosed herein may comprise phosphor-converted or direct-color LEDs. Individual LEDs in the arrays may have light emitting surfaces having areas ranging from a few square micrometers (microLEDs) to square millimeters (conventional LEDs).

The LED arrays disclosed herein may be advantageously employed in any of the devices and applications listed above in the Background section.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
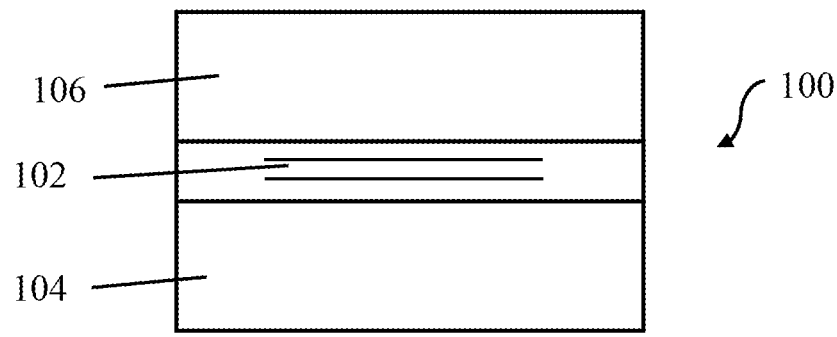
FIG. 1 shows a schematic cross-sectional view of an example pcLED.

FIG. 1 shows an example of an individual pcLED 100 comprising a light emitting semiconductor diode (LED) structure 102 disposed on a substrate 104, and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits ultraviolet, blue, green, or red light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output and color specifications from the pcLED.

Figure 2A:
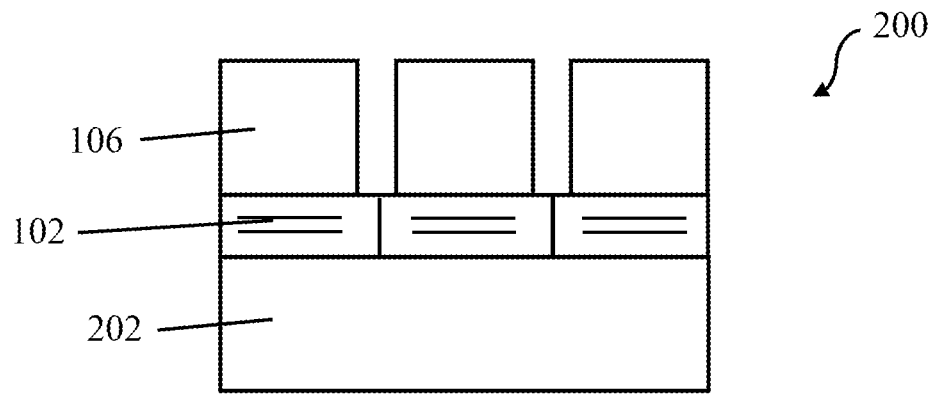
FIGS. 2A and 2B show, respectively, cross-sectional and top schematic views of an array of pcLEDs.
Figure 2B:
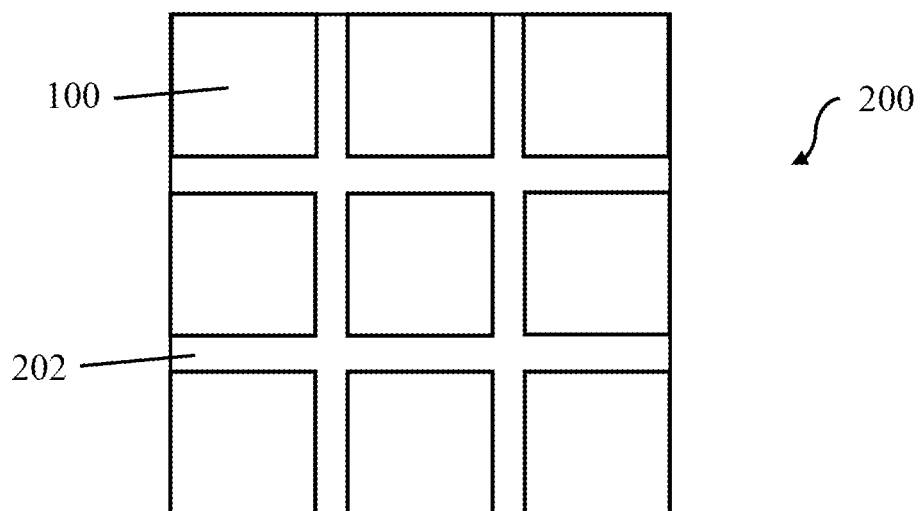

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED and may be formed from any suitable materials.

Although FIGS. 2A-2B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape or arrangement.

LEDs having dimensions in the plane of the array (e.g., side lengths) of less than or equal to about 50 microns are typically referred to as microLEDs, and an array of such microLEDs may be referred to as a microLED array.

An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
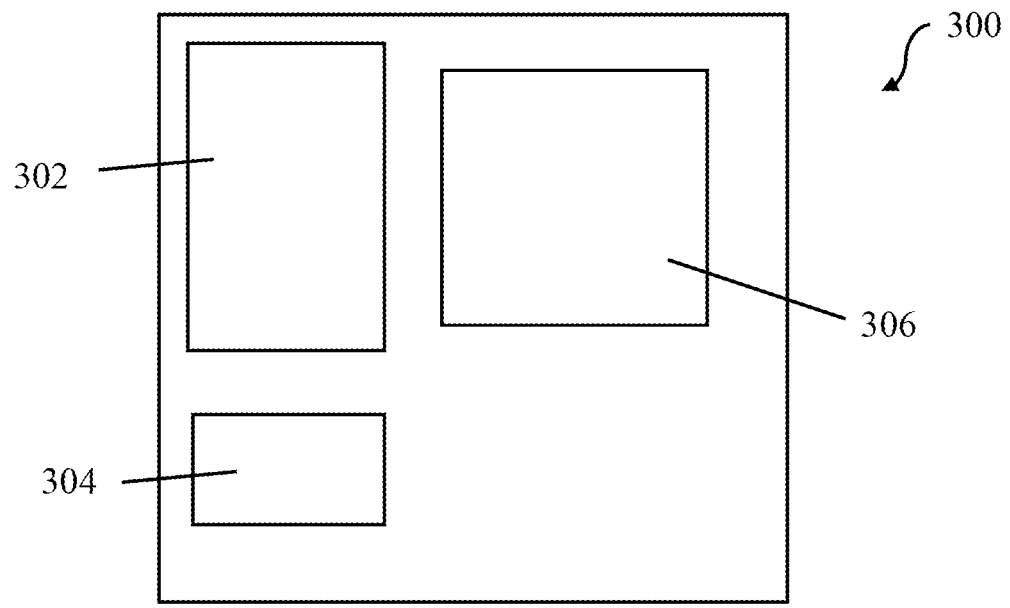
FIG. 3A shows a schematic top view of an electronics board on which an array of pcLEDs may be mounted, and FIG. 3B similarly shows an array of pcLEDs mounted on the electronic board of FIG. 3A.
Figure 3B:
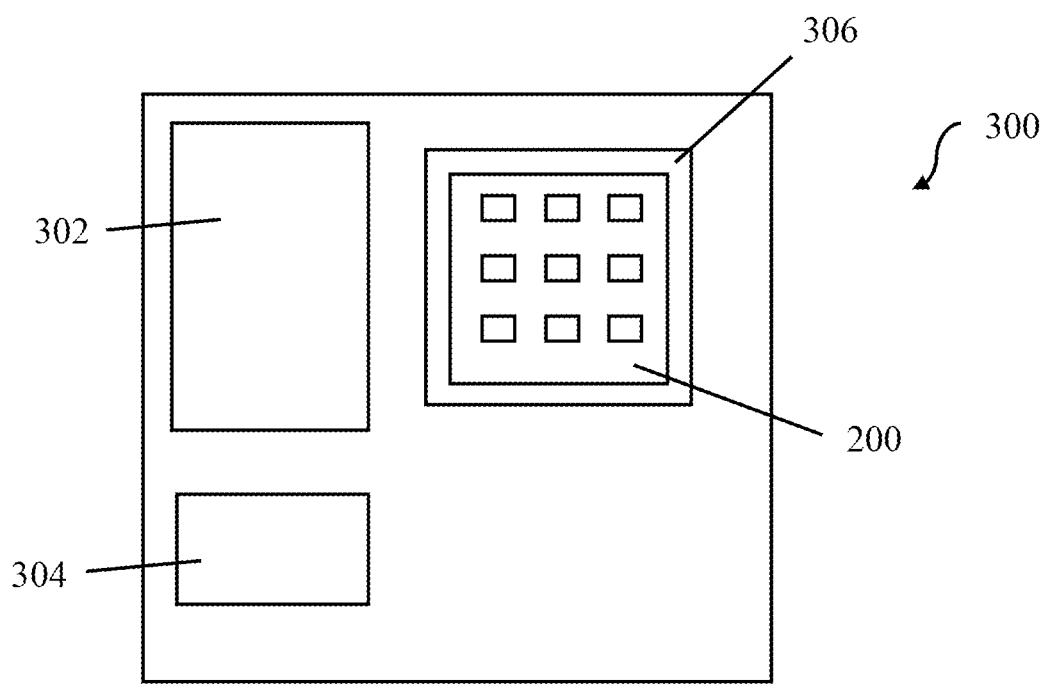

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
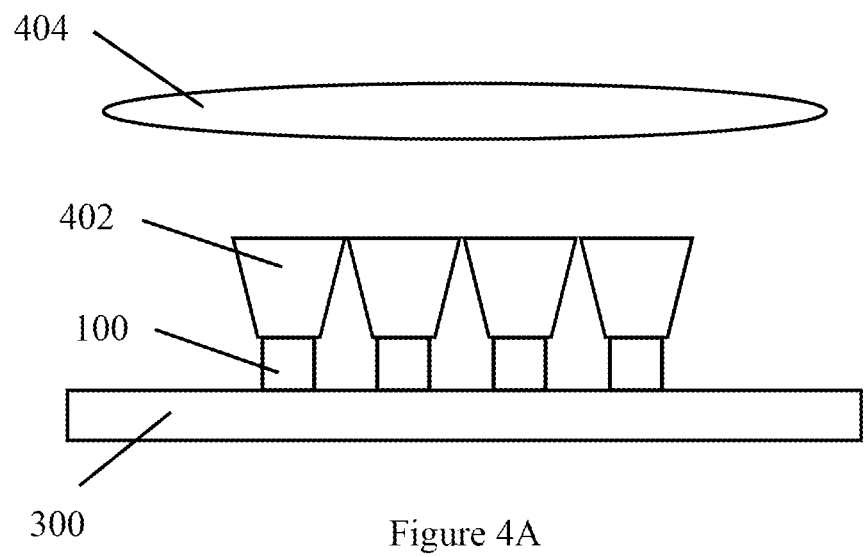
FIG. 4A shows a schematic cross-sectional view of an array of pcLEDs arranged with respect to waveguides and a projection lens.
Figure 4B:
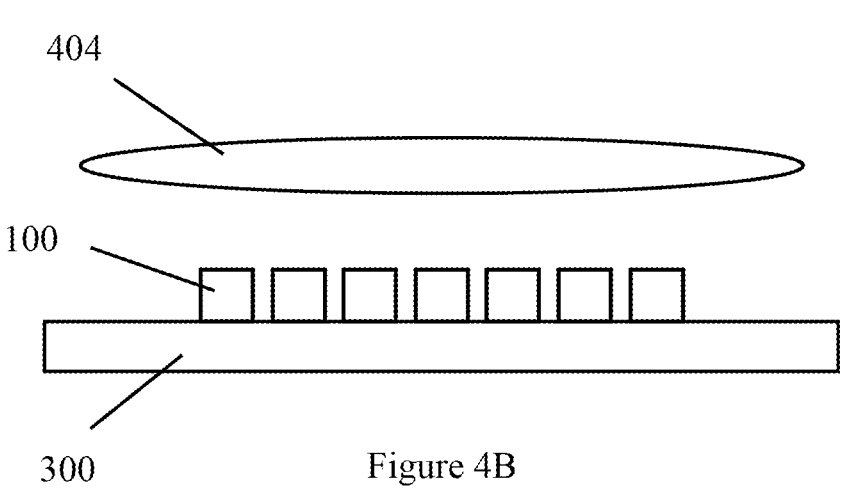
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may be particularly suitable when pcLEDs can be spaced sufficiently close to each other and may also be used in automobile headlights as well as in camera flash applications. A microLED display application may use similar optical arrangements to those depicted in FIGS. 4A-4B, for example. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications.

Figure 5:
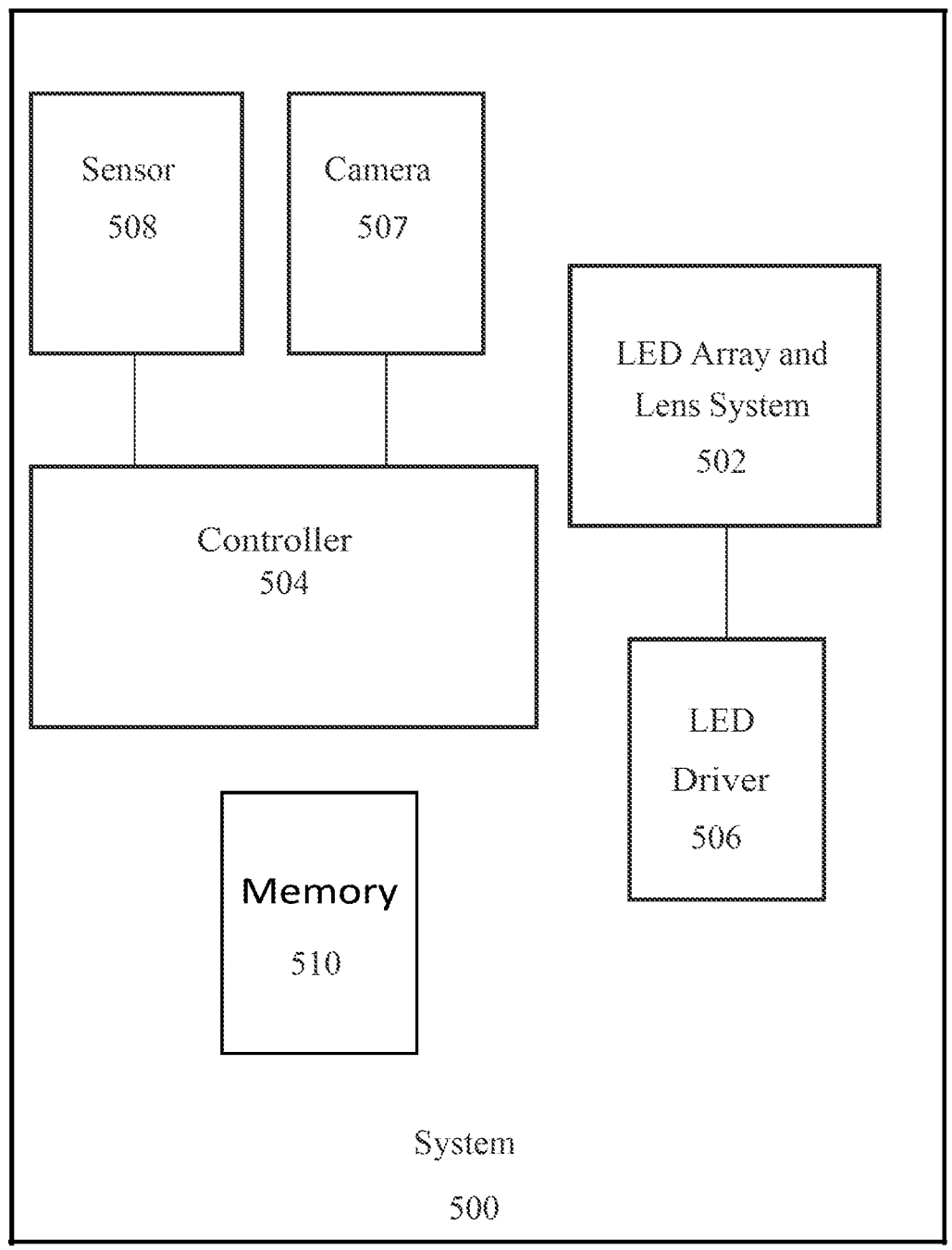
FIG. 5 schematically illustrates an example camera flash system comprising an adaptive illumination system.

FIG. 5 schematically illustrates an example camera flash system 500 comprising an LED array and lens system 502, which may be similar or identical to the systems described above. Flash system 500 also comprises an LED driver 506 that is controlled by a controller 504, such as a microprocessor. Controller 504 may also be coupled to a camera 507 and to sensors 508, and operate in accordance with instructions and profiles stored in memory 510. Camera 507 and adaptive illumination system 502 may be controlled by controller 504 to match their fields of view.

Sensors 508 may include, for example, positional sensors (e.g., a gyroscope and/or accelerometer) and/or other sensors that may be used to determine the position, speed, and orientation of system 500. The signals from the sensors 508 may be supplied to the controller 504 to be used to determine the appropriate course of action of the controller 504 (e.g., which LEDs are currently illuminating a target and which LEDs will be illuminating the target a predetermined amount of time later).

In operation, illumination from some or all pixels of the LED array in 502 may be adjusted—deactivated, operated at full intensity, or operated at an intermediate intensity. Beam focus or steering of light emitted by the LED array in 502 can be performed electronically by activating one or more subsets of the pixels, to permit dynamic adjustment of the beam shape without moving optics or changing the focus of the lens in the lighting apparatus.

Figure 6:
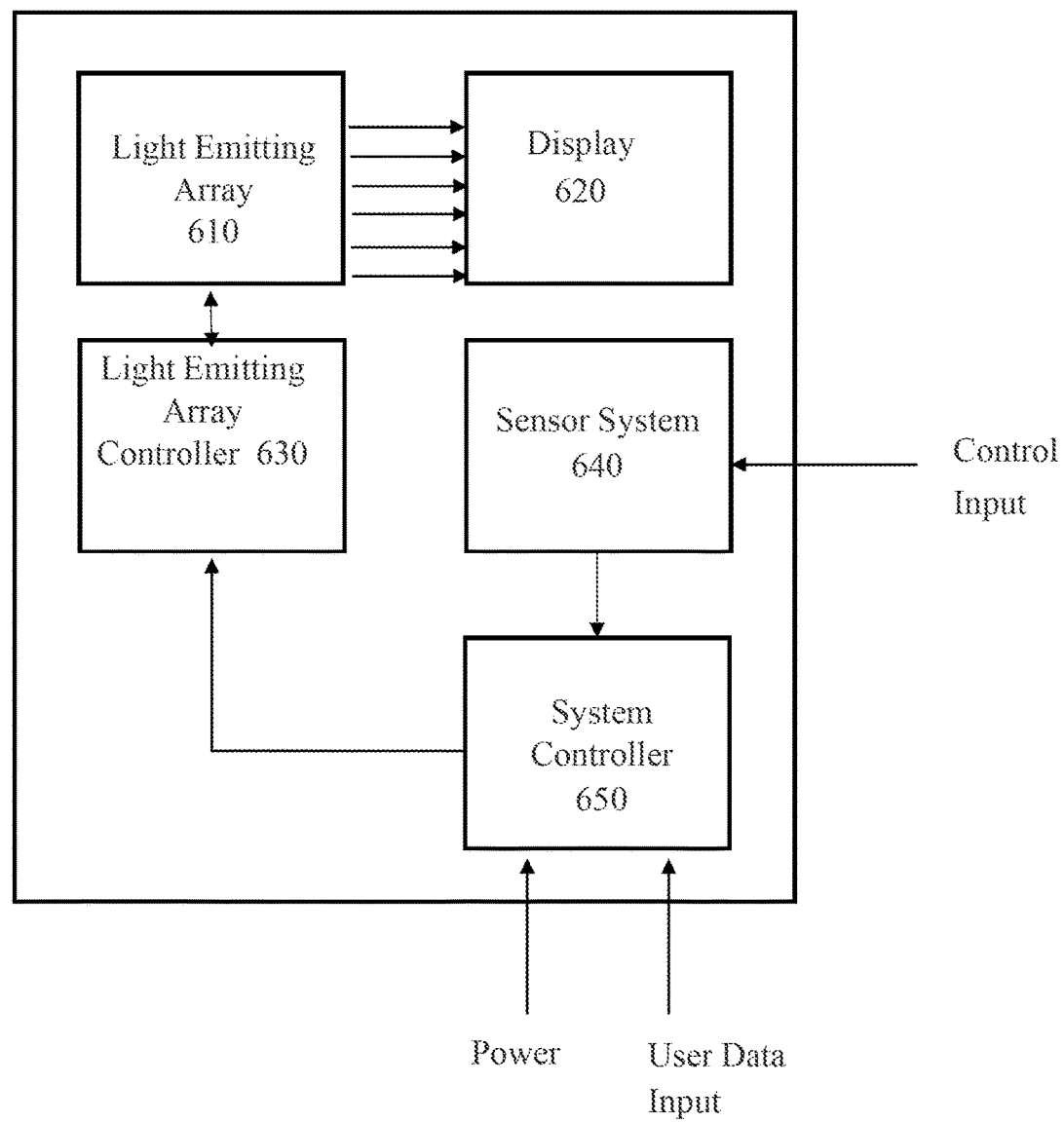
FIG. 6 schematically illustrates an example display (e.g., AR/VR/MR) system that includes an adaptive illumination system.

FIG. 6 schematically illustrates an example display (e.g., AR/VR/MR) system 600 that includes an adaptive light emitting array 610, display 620, a light emitting array controller 630, sensor system 640, and system controller 650. Control input is provided to the sensor system 640, while power and user data input is provided to the system controller 650. In some embodiments modules included in system 600 can be compactly arranged in a single structure, or one or more elements can be separately mounted and connected via wireless or wired communication. For example, the light emitting array 610, display 620, and sensor system 640 can be mounted on a headset or glasses, with the light emitting controller and/or system controller 650 separately mounted.

The light emitting array 610 may include one or more adaptive light emitting arrays, as described above, for example, that can be used to project light in graphical or object patterns that can support AR/VR/MR systems. In some embodiments, arrays of microLEDs can be used.

System 600 can incorporate a wide range of optics in adaptive light emitting array 610 and/or display 620, for example to couple light emitted by adaptive light emitting array 610 into display 620.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As summarized above, this specification discloses LED arrays comprising patterned reflective grids that enhance the contrast ratio between adjacent pixels or adjacent groups of pixels in the array, and fabrication methods for such LED arrays. If the reflective grid is formed as a reflective metal grid, this approach to reducing light leakage (also known as "cross-talk") between adjacent pixels in LED arrays can use side wall electrical contacts in each pixel formed by coating pixel side walls with a highly reflective metal or metal alloy. This creates a metal grid in between pixels in the LED array. Light confinement in each pixel is further enhanced by patterning the top surface of the metal grid. The patterned metal surface promotes light scattering, increases the absorption of side emission, and therefore reduces light spill from "ON" state pixels to neighboring "OFF" state pixels. The top surface of a reflective grid formed instead from dielectric reflectors or DBRs rather than from metal reflectors may similarly be patterned to further enhance light confinement.

Although FIGS. 7, 8A-8D, 9A-9C, and 10A-10B and related description are primarily directed to LED arrays comprising a patterned metal reflective grid, they also indicate the structure and fabrication methods for LED arrays comprising patterned reflective grids formed with non-metal reflectors, such as for example grids formed from DBRs or dielectric reflectors.

Figure 7:
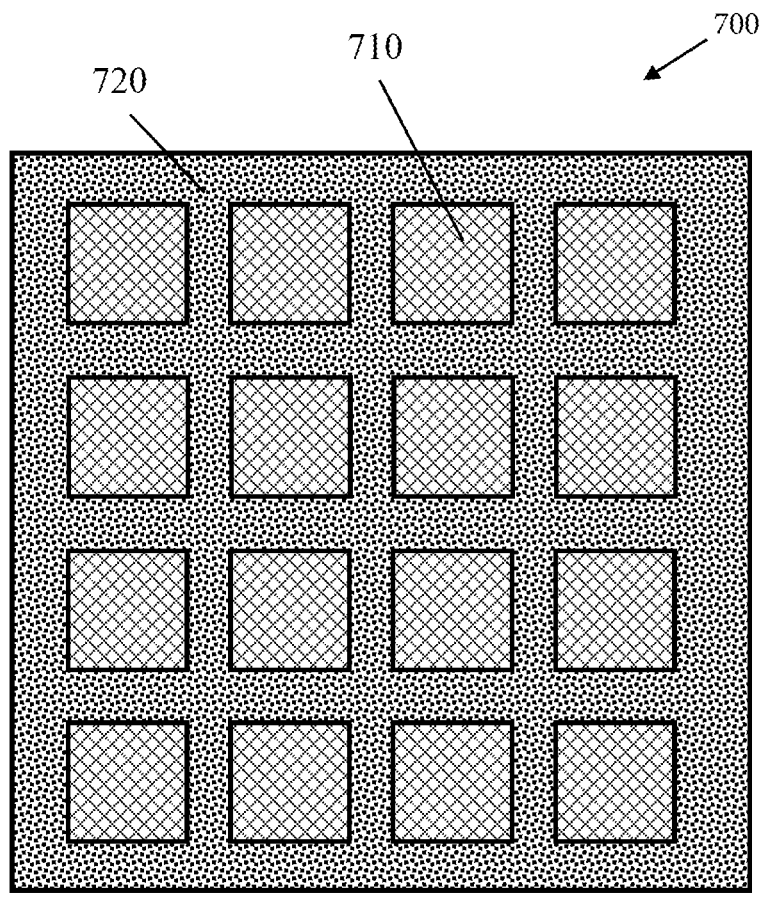
FIG. 7 shows a schematic top view of an example LED array comprising a patterned reflective grid.

FIG. 7 shows a top view of an LED array 700 comprising a patterned reflective metal grid, which may be similar in structure and dimensions to the LED array 200 shown in FIG. 2B and may be a monolithic structure. LED array 700 comprises LEDs 710 optically isolated from each other by a metal grid 720. As illustrated, the top surface of metal grid 720 is patterned or roughened (both referred to herein as "patterned"), as are the top surfaces of LEDs 710. In the embodiments illustrated in this figure and further discussed below the metal grid also serves as the cathode for this array, but this is optional. The metal grid may instead serve as an anode, or alternatively not function as an electrical contact to the diode.

The patterns on the metal grid and on the LEDs may have identical shape, size and spacing. Alternatively, the patterns on the metal grid and on the LEDs may have different shape and size or spacing across the pixel field and/or metal grid. The shape, size and spacing of such patterns can be optimized for different applications and wavelengths. In the example of FIG. 7, the pattern on the metal grid 720 differs from that on the LEDs 710.

The patterns on the metal grid and on the LEDs may for example comprise features having cone-like shapes, sizes ranging from hundreds of nanometers to a few microns in a lateral direction in the plane of the array (e.g., 100 nm, 300 nm, 500 nm, 1 micron, 2 microns, 5 microns, 10 microns), heights perpendicular to the plane of the array ranging from hundreds of nanometers to a few microns (e.g., 100 nm, 300 nm, 500 nm, 1 micron, 2 microns, 5 microns, 10 microns), and spacings between features ranging from tens of nanometers to about a few microns (e.g., 10 nm, 30 nm, 50 nm, 100 nm, 300 nm, 500 nm, 1 micron, 2 microns, 5 microns, 10 microns.

The metal grid may be formed from or comprise, for example, aluminum, copper with an aluminum coating, or a layer stack of aluminum, titanium tungsten, and plated copper.

As further discussed below, the patterned surfaces of the metal grid and the LEDs can be created by growing the epitaxial layers of the semiconductor diode structure on a patterned substrate, defining pixels (individual LEDs) of the array with trenches in the semiconductor diode structure that reach the patterned substrate, depositing metal into the trenches to form the metal grid, and afterward removing the substrate (for example, by a laser lift off process). Patterned reflective grids of dielectric reflectors or DBRs (rather than reflective metal) may be similarly formed by depositing the dielectric reflectors or DBRs in the trenches instead of the metal.

Alternatively, the epitaxial structure and metal grid may be grown on a planar substrate, and the surface patterns created after removal from the planar substrate. This is also true for reflective grids formed from dielectric reflectors or DBRs.

Patterning of the reflective grid and the LED surfaces provides improved light extraction efficiency in combination with enhanced contrast ratio, sharper images, and better control on the beam profile/projection in LED arrays/displays by increasing the optical isolation between "ON" and "OFF" state pixels. In addition, the patterning enhances the adhesion of any layers deposited or sedimented on top of the patterned surface. For example, in a phosphor converted LED array or display phosphor layers are deposited or sedimented on the surface for photon conversion. The patterned reflective grid and LED die surfaces will promote the adhesion of phosphor or other layers (e.g., encapsulant layers) or secondary optics on the heterogenous surface of LED pixels.

Figure 8A:
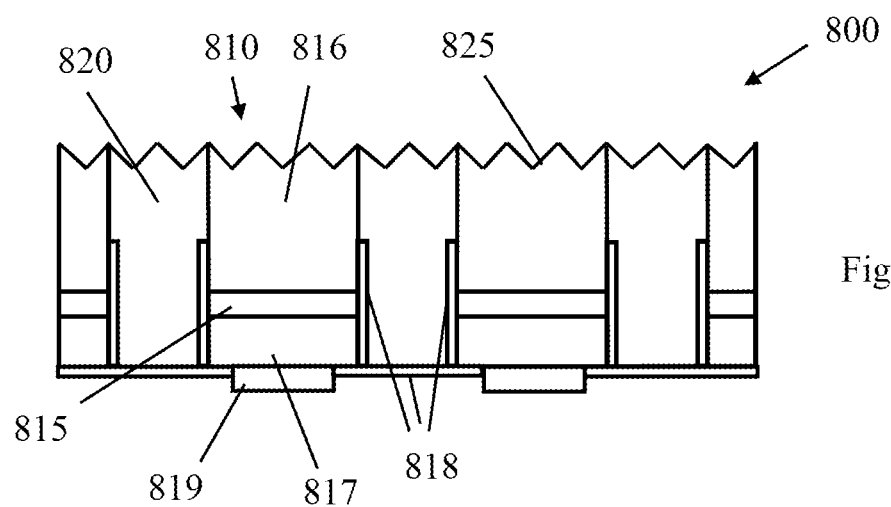
FIG. 8A shows a schematic cross-sectional view of a portion of an LED array as in FIG. 7.

FIG. 8A shows a cross-sectional view of a portion of an LED array 800 comprising a patterned metal grid as described above. LED array 800 comprises LEDs 810 separated and optically isolated from each other by metal grid portions 820 formed from reflective metal. In the illustrated example each LED 810 comprises an active region 815 sandwiched between an n-type region 816 and a p-type region 817. Metal grid portions 820 are isolated from p-type regions 817 by insulator layers 818 and form electrical contacts to n-type regions 816. The metal grid thus serves as a cathode contact. Anode contacts 819 provide electrical contact to the p-type regions.

A light extraction top surface 825 in the plane of the array is patterned, as described above. In the illustrated example the pattern on the top surfaces of the metal grid portions 820 is identical to that on the top light emitting surfaces of the LEDs 810, but as noted above these patterns may differ.

In some embodiments, the metal grid portions (cathode contacts) may have a lateral width in the plane of the array of about 2 microns to about 10 microns, the center to center spacing of metal grid portions forming opposite side walls of a pixel 820 may be about 40 microns (e.g., 30 microns to 50 microns), the thickness of the epitaxial semiconductor structure (n-type region, active region, and p-type region) perpendicular to the plane off the array may be about 6 microns or less, and the height of the surface features in the patterned surfaces perpendicular to the plane of the array may be about 1 to 2 microns. Any other suitable dimensions may be used.

Figure 8B:
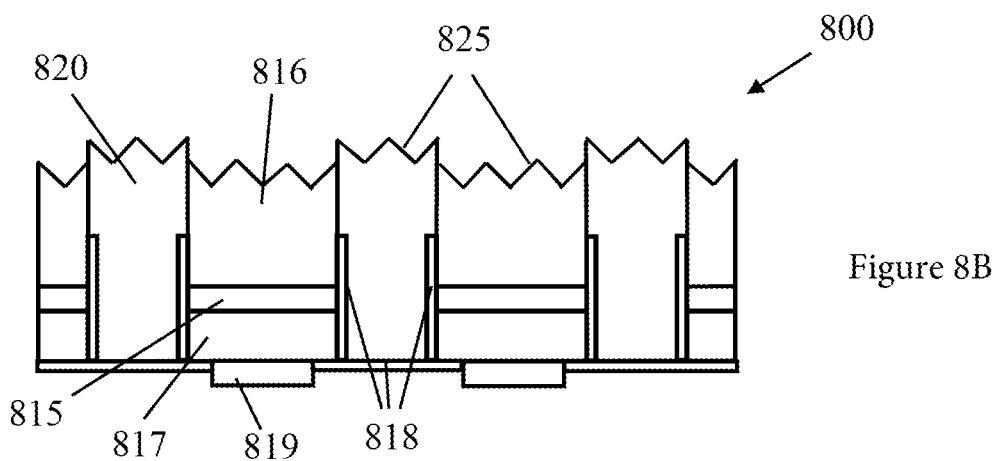
FIG. 8B shows a schematic cross-sectional view of a portion of a variation of the LED array as in FIG. 8A.

As shown in FIG. 8B, in some variations the patterned surfaces of the metal grid portions 820 extend above the light emitting surfaces of the LEDs 810. This pixel geometry results in a better reflection/trapping of lateral radiation within each pixel and therefore improves contrast ratio. The metal grid portions may extend above the LED surfaces by, for example, about 1 to about 10 microns.

Figure 8C:
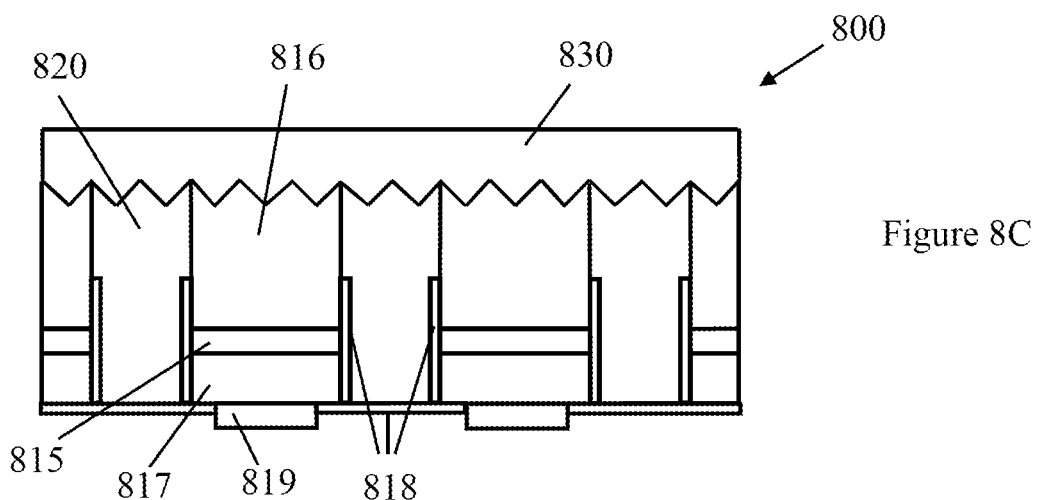
FIG. 8C shows a schematic cross-sectional view of a portion of an LED array as in FIG. 8A, comprising a wavelength converting structure.
Figure 8D:
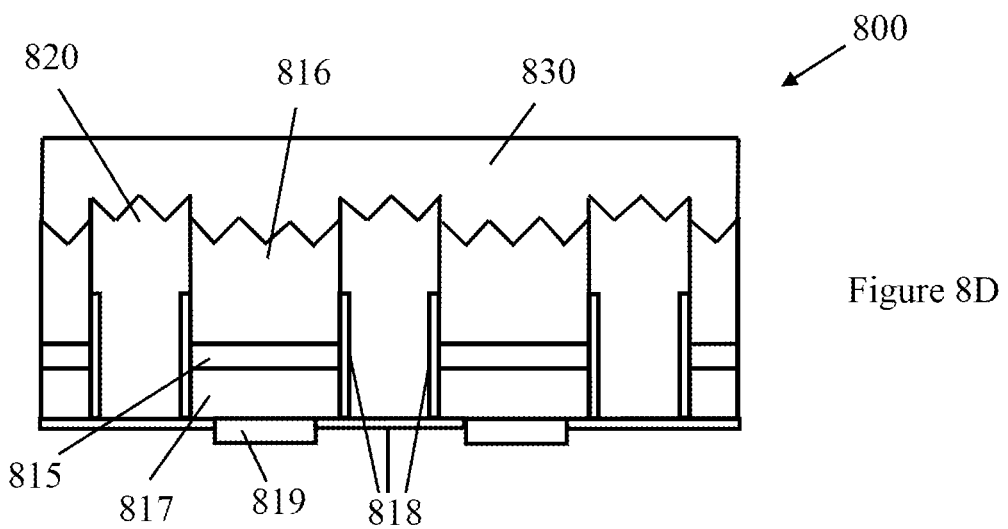
FIG. 8D shows a schematic cross-sectional view of a portion of an LED array as in FIG. 8B, comprising a wavelength converting structure.

As shown in FIGS. 8C and 8D, a wavelength converting structure 830 may be formed on or attached to the patterned light extraction surface 825 of the semiconductor LED array. The wavelength converting structure may, for example, comprise phosphor particles disposed in a binder material. The phosphor particles absorb light emitted by the semiconductor LEDs and in response emit longer wavelength light. The binder material, which may be a silicone for example, is selected to transmit light emitted by the semiconductor LEDs and light emitted by the phosphor particles. The wavelength converting structure may, for example, have a thickness perpendicular to surface 825 of about 5 microns to about 40 microns, or about 10 microns to about 15 microns, and may for example comprise phosphor particles having a diameter of less than or equal to about 15 microns, less than or equal to about 10 microns, or less than or equal to about 5 microns.

Patterning the reflective (e.g., reflective metal) grid as described herein can help to reduce lateral propagation of light in the wavelength converting structure and thereby enhance CR for the phosphor converted LED array. The patterned reflective grids are particularly beneficial for thin low-scattering wavelength converting structures.

Figure 9A:
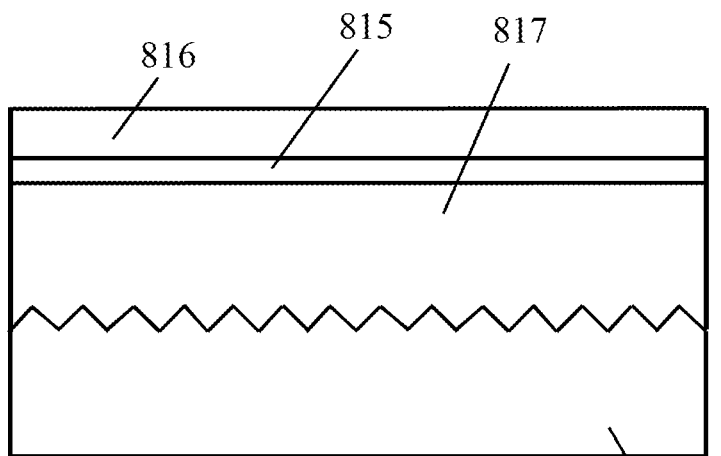
FIGS. 9A, 9B, and 9C show stages during an example method of fabricating the LED array of FIG. 8A.

As noted above LED arrays comprising patterned reflective grids as disclosed herein may be grown on a patterned substrate. Referring now to FIG. 9A, a patterned substrate 900 may be formed for example from sapphire, silicon carbide, silicon, gallium nitride, gallium arsenide or any other suitable material. The patterns on the substrate can be formed by wet and/or dry etching or a nanoimprint process and can be created on the substrate or added on top of it. That is, the patterned portion of the substrate can be formed from the same material composition as the rest of the underlying substrate or have a different composition. The shape, size and spacing of the patterns can be optimized depending on the LED color or application requirements. If the reflective (e.g., metal) grid surfaces and the LED die surfaces are to have different patterns, corresponding portions of the substrate may be patterned accordingly.

Epitaxial layers 817, 815, and 816 can be grown on substrate 900 using any of the conventional growth techniques such as, for example, MOCVD and MBE. The epitaxial layer grown directly on the patterned substrate takes on a complementary pattern to that of the substrate.

Figure 9B:
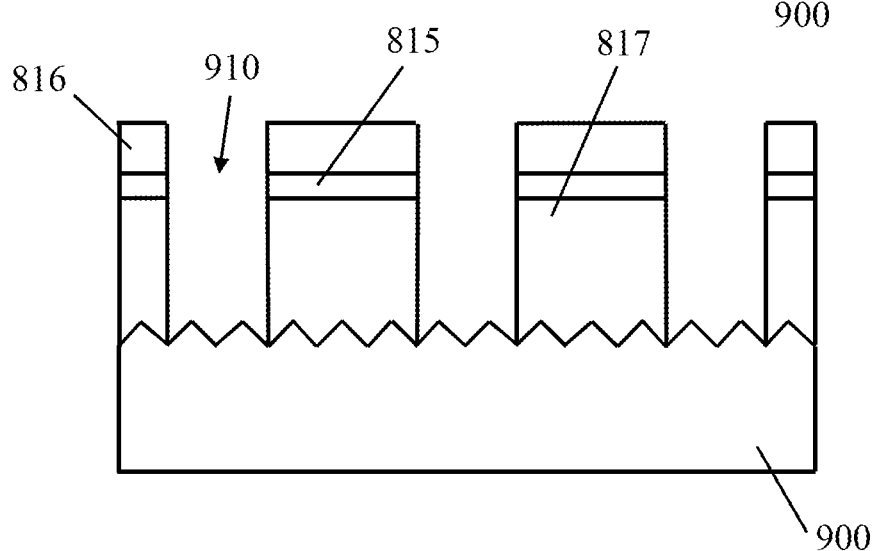
Figure 9C:
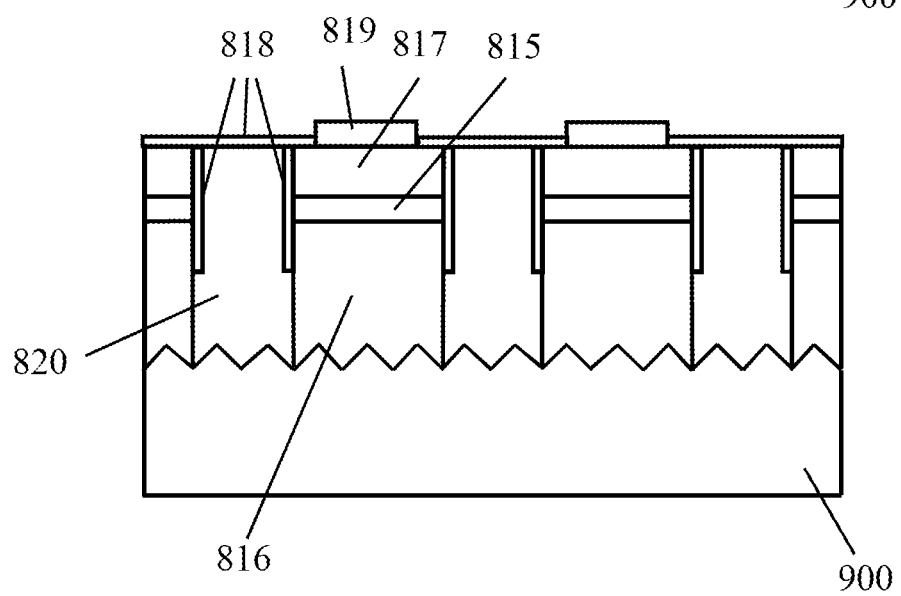

As shown in FIG. 9B, after the epitaxial layers are grown LED pixels or dies are defined in the array by etching trenches 910 through the epitaxial layers down to the patterned substrate, by a wet and/or dry etch process, to form side walls on the defined pixels. Referring now to FIG. 9C, insulating layers 818 may be deposited in the trenches, and then reflective metal deposited in the trenches to form a reflective metal grid, which in the illustrated example also serves as a cathode contact. The bottom of the trench reaches the patterned substrate, so the portion of the metal grid formed in contact with the substrate takes on a complementary pattern to that of the substrate.

The metal grid may be formed by electroplating. Electroplating needs a seed-layer, usually the same material as that to be electroplated (e.g., aluminum). Alternatively, a seed layer of a different material may be used, for example a more strongly absorbing metal material such as, for example a titanium tungsten alloy. In one variation, a metal (e.g., aluminum) n-contact layer is deposited on side walls of the n-type layer, then a titanium tungsten seed layer is deposited in the bottom of the trench, then the remaining portion of the metal grid is electroplated into the trench. This approach may enhance CR (by using an optically absorbing material at the patterned surface of the metal grid) without compromising the n-contact quality (and hence forward voltage, Vf) of the device.

Next, the substrate is removed using a wafer removal process such as laser lift-off in which a high energy laser beam removes the substrate. The substrate removal leaves patterned surfaces on the die/pixel field and the exposed metal grid in between the pixels.

Figure 10A:
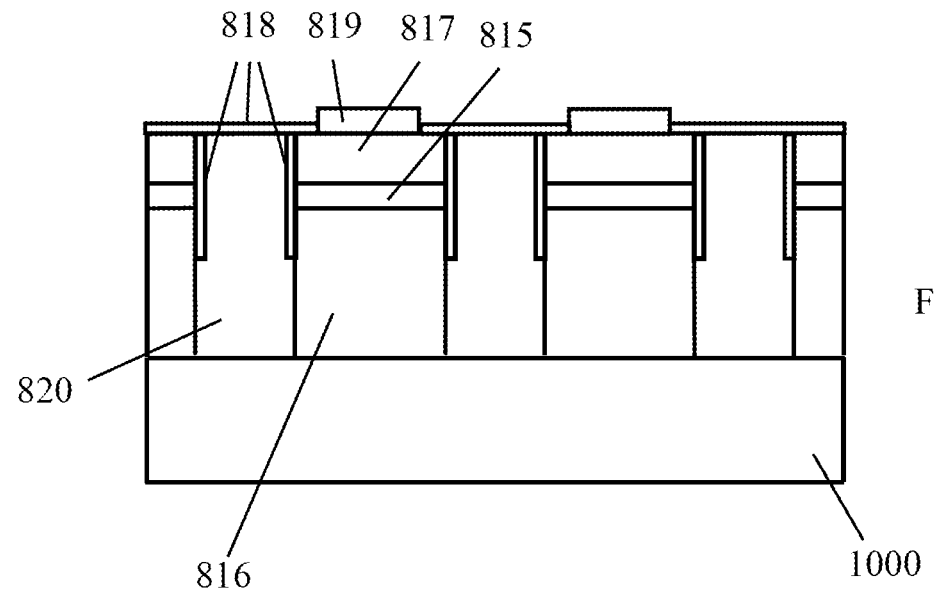
FIGS. 10A and 10B show stages during another example method of fabricating the LED array of FIG. 8A.
Figure 10B:
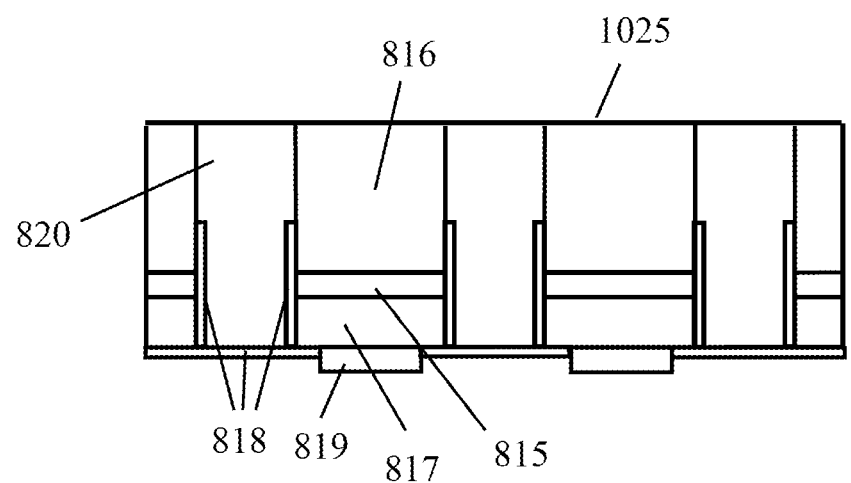

Referring now to FIGS. 10A and 10B, the process steps described above may be performed on a planar surface of a substrate 1000. Upon substrate removal, the exposed surfaces 1025 of the metal grid and the LEDs will be planar. These planar surfaces may then be patterned using wet and/or dry etch processes to provide desired patterns as disclosed above.

After substrate removal (and surface patterning if a planar substrate was used), a cleaning solution can be used to remove any residues from the lift off process and to further shape the created patterns as required. If the reflective grid is a reflective metal grid, the cleaning solution should be selected to not attack metal layers. After this surface cleaning, phosphor or protective or secondary optics layers may be added on top of these patterns to create a blanket or segmented top layer on the die field and metal grid.

Referring again to FIG. 8B, an LED array in which the patterned surfaces of the reflective (e.g., metal) grid portions 820 extend above the light emitting surfaces of the LEDs 810 may be formed, for example, by etching trenches through the epitaxial layers (FIG. 9B) and into the substrate. Alternatively, after substrate removal the light extraction surfaces 825 of the LEDs may be selectively etched so that the patterned surfaces of the reflective grid portions extend beyond the etched patterned surfaces of the LEDs provided that the reflective grid is protected from the etch process.

This disclosure is illustrative and not limiting. Further modifications will be apparent to one skilled in the art in light of this disclosure and are intended to fall within the scope of the appended claims.

What is claimed is:

1. A light emitting diode array comprising:
a plurality of light emitting diodes each comprising a light emitting surface and a bottom diode surface opposite the light emitting surface, the light emitting surface comprising a pattern with features that comprise doped semiconductor material; and
a reflective grid defining a plurality of openings in which corresponding ones of the light emitting diodes are disposed with their light emitting surfaces facing in a same direction out of the reflective grid, the reflective grid providing reflective side walls for each light emitting diode, the reflective side walls comprising patterned light scattering surfaces arranged adjacent to the light emitting surfaces and facing in the same direction as the light emitting surfaces.

2. The light emitting diode array of claim 1, wherein the features consist of n-type semiconductor material.

3. The light emitting diode array of claim 1, wherein the features of the pattern of the light emitting surface and second features of the patterned light scattering surfaces have at least one of different shapes, size, or spacing from each other.

4. The light emitting diode array of claim 2, wherein the features of the pattern of the light emitting surface and second features of the patterned light scattering surfaces comprise a different material from each other.

5. The light emitting diode array of claim 1, wherein the patterned light scattering surfaces are coplanar with adjacent light emitting surfaces.

6. The light emitting diode array of claim 1, wherein an entirety of the patterned light scattering surfaces extend beyond the light emitting surfaces in the direction in which the light emitting surfaces are facing.

7. The light emitting diode array of claim 1, wherein the reflective grid is or comprises a reflective metal grid that provides electrical contact to the light emitting diodes.

8. The light emitting diode array of claim 1, comprising a wavelength converting structure disposed on the light emitting surfaces and the patterned light scattering surfaces.

9. The light emitting diode array of claim 1, wherein the patterned light scattering surfaces of the reflective grid consist of a same one or more materials as the reflective side walls of the reflective grid.

10. The light emitting diode array of claim 9, comprising a wavelength converting structure disposed on the light emitting surfaces and the patterned light scattering surfaces, wherein:
the light emitting surfaces are patterned to scatter light;
the wavelength converting structure has a thickness of less than about 30 microns in the direction in which the light emitting surfaces face; and
the wavelength converting structure comprises phosphor particles dispersed in a binder, the phosphor particles having diameters less than about 20 microns and larger than 1 micron.

11. A display system comprising:
the light emitting diode array of claim 1;
a display; and
a lens or lens system spaced apart from the light emitting diode array and arranged to couple light from the light emitting diode array into the display.

12. The light emitting diode array of claim 1, wherein the light emitting diodes comprise a doped semiconductor region and an active layer in direct contact with the doped semiconductor region, wherein the doped semiconductor region is continuous with the features of the pattern of the light emitting surface.

* * * * *